United States Patent
Zhou (10) Patent No.: US 9,727,411 B2
(45) Date of Patent: Aug. 8, 2017

(54) METHOD AND PROCESSOR FOR WRITING AND ERROR TRACKING IN A LOG SUBSYSTEM OF A FILE SYSTEM

(71) Applicant: MStar Semiconductor, Inc., Hsinchu Hsien (TW)

(72) Inventor: Tao Zhou, Shanghai (CN)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 85 days.

(21) Appl. No.: 14/584,729

(22) Filed: Dec. 29, 2014

(65) Prior Publication Data

US 2015/0186207 A1   Jul. 2, 2015

(30) Foreign Application Priority Data

Dec. 30, 2013   (CN) .......................... 2013 1 0747007

(51) Int. Cl.
*G06F 11/10*   (2006.01)
*H03M 13/29*   (2006.01)
(Continued)

(52) U.S. Cl.
CPC .......... *G06F 11/10* (2013.01); *G06F 11/1004* (2013.01); *G06F 11/1435* (2013.01);
(Continued)

(58) Field of Classification Search
CPC .. G06F 11/10; G06F 11/1004; G06F 11/1064; G06F 11/1471; G06F 17/30067;
(Continued)

(56) References Cited

U.S. PATENT DOCUMENTS 5,832,515 A * 11/1998 Ledain ................... G06F 3/0619
6,732,124 B1 * 5/2004 Koseki ................ G06F 11/1435
(Continued)

FOREIGN PATENT DOCUMENTS

CN   101430657   5/2009
CN   102419766   4/2012
(Continued)

OTHER PUBLICATIONS

Taiwan Patent Office, "Office Action," dated Aug. 10, 2015.
State Intellectual Property Office of the People's Republic of China, Office Action dated Jan. 22, 2017.

*Primary Examiner* — Albert Decady
*Assistant Examiner* — Christian Dorman
(74) *Attorney, Agent, or Firm* — WPAT, PC (57) ABSTRACT

A method for error tracking a log subsystem of a file system is provided. The method includes: when a data block of the log subsystem is recovered to an original position in the file system, calculating a verification code of the data block to obtain a second verification code; determining whether a verification result between the second verification code and a first verification code of the data block stored in a spare space in a submit block of the log subsystem in a disk is consistent; and when the verification result is inconsistent, processing the data block corresponding to the inconsistent verification result. With the above method, given that system performance is least affected, an error and a position of the error of the log subsystem of the file system can be more accurately detected to enhance the reliability of the log subsystem.

22 Claims, 6 Drawing Sheets

---

S101 — Calculating verification code of data block when log subsystem of file system writes data block to disk to obtain first verification code S102 — Storing first verification code of data block to spare space in submit block of log subsystem in disk (51) Int. Cl.
*H03M 13/09* (2006.01)
*H03M 13/05* (2006.01)
*G06F 11/14* (2006.01)
H03M 13/35 (2006.01)

(52) U.S. Cl.
CPC ........... *H03M 13/05* (2013.01); *H03M 13/09* (2013.01); *G06F 2201/82* (2013.01); *H03M 13/29* (2013.01); *H03M 13/35* (2013.01); *H03M 13/356* (2013.01)

(58) Field of Classification Search
CPC ........ G06F 17/30144; G06F 17/30185; H03M 13/09; H03M 13/29; H03M 13/35; H03M 13/356
See application file for complete search history.

(56) References Cited

U.S. PATENT DOCUMENTS

| | | | | |
|---|---|---|---|---|
| 2004/0236793 A1* | 11/2004 | Kanai | .................... | G06F 9/466 |
| 2011/0078407 A1* | 3/2011 | Lewis | ............... | G06F 17/30191 |
| | | | | 711/213 |
| 2011/0099458 A1* | 4/2011 | Reche | .................... | G06F 11/073 |
| | | | | 714/763 |
| 2013/0067270 A1* | 3/2013 | Lee | ..................... | G06F 11/1004 |
| | | | | 714/6.1 |
| 2014/0047298 A1* | 2/2014 | Radke | ................. | G06F 11/1068 |
| | | | | 714/763 |

FOREIGN PATENT DOCUMENTS

| CN | 102937922 | 2/2013 |
|---|---|---|
| TW | I235923 | 7/2005 |

* cited by examiner

METHOD AND PROCESSOR FOR WRITING AND ERROR TRACKING IN A LOG SUBSYSTEM OF A FILE SYSTEM

This application claims the benefit of People's Republic of China application Serial No. 201310747007.5, filed Dec. 30, 2013, the subject matter of which is incorporated herein by reference.

BACKGROUND OF THE INVENTION

Field of the Invention

The invention relates in general to a computer storage technology, and more particularly to a method and apparatus for writing a log subsystem of a file system, and a method and apparatus for error tracking a log subsystem of a file system.

Description of the Related Art

A file system, an essential constituent of a modern operating system, is in charge of organization and management of a disk. Further, through a universal interface, a file system also provides various file-associated operations for application programs in a convenient and efficiency manner, such as details associated with masking application programs, data storage and physical properties of the disk.

The reliability of data storage is a critical factor in evaluating the quality of a file system. A power disconnection easily results in an incomplete writing process for data that is currently being written into a file system, which may then become damaged in a next boot process due to data inconsistency. To overcome such drawback, many file systems have incorporated log subsystems. For every data writing process, data is first written into a log subsystem, and is later written from the log subsystem to an originally intended position at an appropriate time point. Thus, in the event of defective data in a log subsystem caused by a power disconnection, only the log subsystem is damaged, and the consistency of the file system is ensured although being a little dated. If a part of the data written into the file system is lost due to the power disconnection, it is ascertained that the corresponding data stored in the log subsystem is intact such that the data may be recovered from the log subsystem to the file system.

Although a log subsystem plays a critical role in ensuring the reliability of a file system, it may also be damaged as a result of malfunctions of software and hardware. The so-called damage refers to a damage that is caused by factors other than a power disconnection. In general, a power disconnection only damages a last set of data written before the power disconnection, while other data damages caused by other factors may affect any block previously written with data. Such damage may further be brought into the file system in a way that the file system may become unusable.

In a current log subsystem, a simple cyclic redundancy check (CRC) verification mechanism is provided. This mechanism calculates a CRC verification code for all data blocks of only one transaction. When a transaction contains a large number of blocks, in the occurrence of data damage, it is difficult for a subsequent analysis to learn an accurate position of the damaged data blocks.

In view of the above, there is a need for a method for log managing a file system to improve drawbacks of the known art.

SUMMARY OF THE INVENTION

The invention is directed to solving a technical issue of providing a method and processor for error tracking a log subsystem of a file system. Given that system performance is least affected, an error and a more accurate position of the error of the log subsystem of the file system are detected to enhance the reliability of the log subsystem.

To solve the above technical issue, the present invention provides a method for writing a log subsystem of a file system. The method includes: when the log subsystem of the file system writes a data block to a disk, calculating a verification code of the data block to obtain a first verification code; and storing the first verification code of the data block to a spare space in a submit block of the log subsystem.

To solve the above technical issue, the present invention provides a method for error tracking of a log subsystem of a file system. The method includes: when a data block of the log subsystem of the file system is recovered to an original position in the file system, calculating a verification code of the data block to obtain a second verification code; determining whether a verification result between the second verification code of the data block and a first verification code of the data block stored in a spare space in a submit block of the log subsystem in the disk is consistent, wherein methods for calculating the first verification code and the second verification code of the data block are consistent; and when the verification result between the second verification code and the first verification code is inconsistent, processing the data block corresponding to the inconsistent verification result.

To solve the above technical issue, the present invention provides a processor. The processor includes: a first verification code obtaining module, configured to calculate a verification code of a data block when a log subsystem of a file system writes the data block to a disk to obtain a first verification code; and a storage module, configured to store the first verification code of the data block to a spare space in a submit block of the log subsystem of the file system.

To solve the above technical issue, the present invention further provides a processor. The processor includes: a second verification code obtaining module, configured to calculate a verification code of a data block of a log subsystem of a file system when the data block is recovered to an original position in the file system; a determination module, configured to determine whether a verification result between the second verification code of the data block and a first verification code of the data block stored in a spare space in a submit block of the log subsystem in the disk is consistent, wherein methods for calculating the first verification code and the second verification code of the data block are consistent; and an execution module, configured to process the data block corresponding to the inconsistent verification result between the second verification code and the first verification code when the verification result between the second verification code and the first verification code is inconsistent.

The present invention provides following effects. In the present invention, when the data block in the log subsystem of the file system is recovered to an original position in the file system, the verification code of the data block is calculated to obtain a second verification code. It is then determined whether a verification result between the second verification code of the data block and a first verification code of the data block stored in a spare space in a submit block of the log subsystem in the disk is consistent. When the verification result between the second verification code of the data block and a first verification code is inconsistent, the data block corresponding to the inconsistent verification code between second verification code of the data block and the first verification code is processed. With the above approach, given that system performance is least affected, an error and a more accurate position of the error of the log subsystem of the file system can be detected to enhance the reliability of the log subsystem.

DETAILED DESCRIPTION OF THE INVENTION

The above and other aspects of the invention will become better understood with regard to the following detailed description of the preferred but non-limiting embodiments. The following description is made with reference to the accompanying drawings. Terms used in the application are explained below. It should be understood that these terms are illustrative and are not to be construed as limitations to the present invention.

In following embodiments of the present invention, a file system is a method and a data structure that an operating system applies on distinct disks or files of different sections, i.e., a method for organizing files on disks. In the embodiments of the present invention, as an independent log subsystem is utilized to track changes of contents in disks, a file system that carries such log subsystem offers better safety than a conventional file system.

In the embodiments of the present invention, a data block is a set of data including several sets of records successively arranged according to an order, and is a data unit transmitted between a main memory, an input/output apparatus and an external memory. A file system and a log subsystem usually write data in a smallest unit of a data block, which ranges from 1 KB to 4 KB in size.

In the embodiments of the present invention, a verification code is a set of data that is obtained through a certain operation and is for checking whether target data is correct. For example, the verification code may include an error correction code (ECC), cyclic redundancy check (CRC), and an odd-even verification code. When a log subsystem of a file system writes a data block to a disk, the data block is calculated to obtain a first verification code. For example, the first verification code may be an ECC code, a CRC code, or an odd-even verification code.

Figure 1:
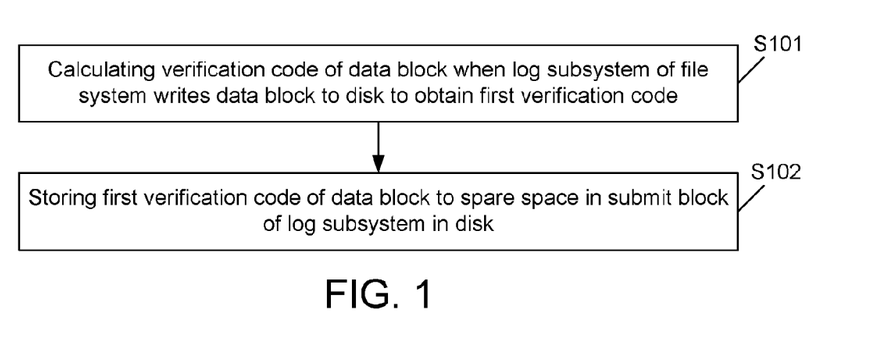
FIG. 1 is a flowchart of a method for writing a log subsystem of a file system according to an embodiment of the present invention.

FIG. 1 shows a flowchart of a method for writing a log subsystem of a file system according to an embodiment of the present invention. Referring to FIG. 1, the method includes following steps.

In step S101, when the log subsystem of the file system writes a data block to a disk, a verification code of the data block is calculated to obtain a first verification code.

In step S102, the calculated first verification code of the data block is stored to a spare space in a submit block of the log subsystem in the disk.

A first data block of a log subsystem is a log superblock, which is followed by blocks that are grouped according to a transaction. One transaction includes one set of blocks, i.e., a description block, a metadata block, a submit block and an undo block. The submit block indicates the end of the current transaction.

For efficiency considerations, a system does not usually immediately write a data block to a disk each time a writing request for that data block arises. Instead, data blocks are gathered as many as possible, and are collectively written to the disk in one operation. In the log subsystem, such collective writing operation is referred to as one transaction. The log subsystem writes a submit block at the end of each transaction written into the disk to indicate the end of that transaction. In a submit block, only 64 bytes are used while the remaining space is empty. In the embodiments of the present invention, the calculated first verification code of the data block is stored to a spare space in a submit block of the log subsystem in the disk.

For example, the first verification codes of all data blocks of a log subsystem are ECC or CRC codes. Alternatively, the first verification codes of a part of data blocks are ECC codes, and the first verification codes of another part of the data blocks are CRC codes. In practice, based on actual applications, appropriate verification codes can be selected when calculating the verification codes of data blocks.

That is to say, when calculating the first verification code, the first verification codes of the data blocks of a log subsystem may be ECC codes or CRC codes. Alternatively, the verification code of a part of data blocks are EC codes and another part of the data blocks are CRC codes. In practice, the verification code may be appropriately selected when calculating the first verification code according to actual applications.

In an embodiment of the present invention, when the log subsystem of the file system writes a data block to the disk, the first verification code of the data block is calculated, and the calculated first verification code of the data block is stored to a spare space in a submit block of the log subsystem in the disk. Since the first verification code of the data block is stored in the spare space in the submit block, such approach requires no additional space for storing the verification code and fully utilizes the spare space in the submit block. Further, compatible data have existing storage formats on the disk.

Figure 2:
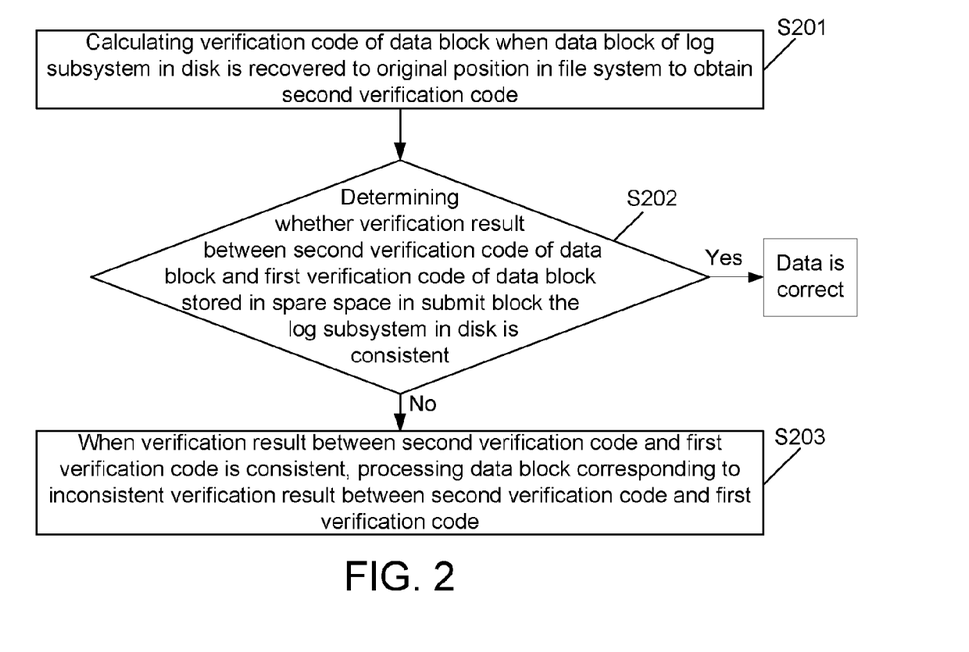
FIG. 2 is a flowchart of a method for error tracking a log subsystem of a file system according to an embodiment of the present invention.

FIG. 2 shows a flowchart of a method for error tracking a log subsystem of a file system according to an embodiment of the present invention. The method includes following steps.

In step S201, when a data block of a log subsystem in a disk is recovered to an original position in a file system, a verification code of the data block is calculated to obtain a second verification code.

In step 202, it is determined whether a verification result between the second verification code of the data block and a first verification code of the data block stored in a spare space in a submit block of the log subsystem in the disk is consistent. Methods for calculating the first verification code and the second verification code are consistent.

As the methods for calculating the first verification code and the second verification code are consistent, when the verification result between the second verification code of the data block and the first verification code of the data block stored in the spare space in the submit block of the log subsystem in the disk is consistent, it means that the data block is correct and without error. Step S203 is performed when the verification result between the second verification code and the first verification code is consistent.

In step S203, when the verification result between the second verification code and the first verification code is inconsistent, the data block corresponding to the inconsistent verification result between the second verification code and the first verification code is processed.

When the verification result between the second verification code and the first verification code is inconsistent, it means that the data block recovered to the original position in the file system and the data block of the log subsystem in the disk are inconsistent and data of the data block recovered to the original position in the file system is incorrect. At this point, the data block corresponding to the inconsistent verification result between the second verification code and the first verification code is processed, so as to allow a user to take active remedial measures.

Figure 3:
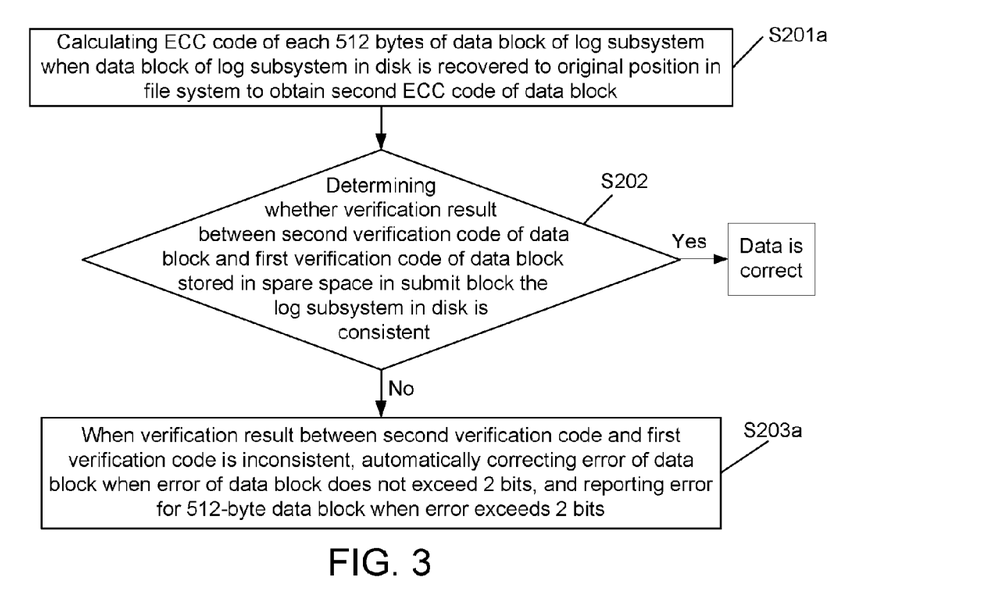
FIG. 3 is a flowchart of a method for error tracking a log subsystem of a file system according to another embodiment of the present invention.

When the first verification codes and the second verification codes of all of the data blocks in the log subsystem are ECC codes, the step of calculating the verification code of the data block to obtain the second verification code in step S201 includes step S201a, and step S203 includes step S203a. Associated details are given below.

When calculating the verification code of the data block in the log subsystem, the verification code of every predetermined number of bytes of the data block in the log subsystem is calculated to obtain the second verification code of the data block. In the example below, it is assumed that the verification code is an ECC code, and the predetermined number of bytes is 512 bytes.

In step S201a, the ECC code of each 512 bytes of the data block of the log subsystem is calculated to obtain a second ECC code of the data block.

In step S203a, when the verification result between the second verification code and the first verification code is inconsistent, for the 512-byte data block, the error of the data block is automatically corrected when the error of the data block does not exceed 2 bits, and the error is reported when the error exceeds 2 bits.

When the log subsystem writes data blocks one after another to the disk, the ECC code (i.e., the first verification code) of every 512 bytes is calculated, and is altogether written into the disk along with the submit block. During a boot process, when data blocks in the log subsystem need to be recovered to an original position in the file system, the log subsystem re-calculates the verification code (i.e., the second verification code) of these data blocks, and compares this verification code with the verification code already stored in the submit block. When the result is inconsistent, an error that does not exceed 2 bits in each data block can be automatically corrected, and an error that exceeds 2 bits is reported. Thus, further analysis may be carried out on the problematic 512-byte data block.

With the first verification code and the second verification code of the data block in form of an ECC code, a correction ability is provided, and a higher accuracy is offered as the minimum error range is 512 bytes.

Figure 4:
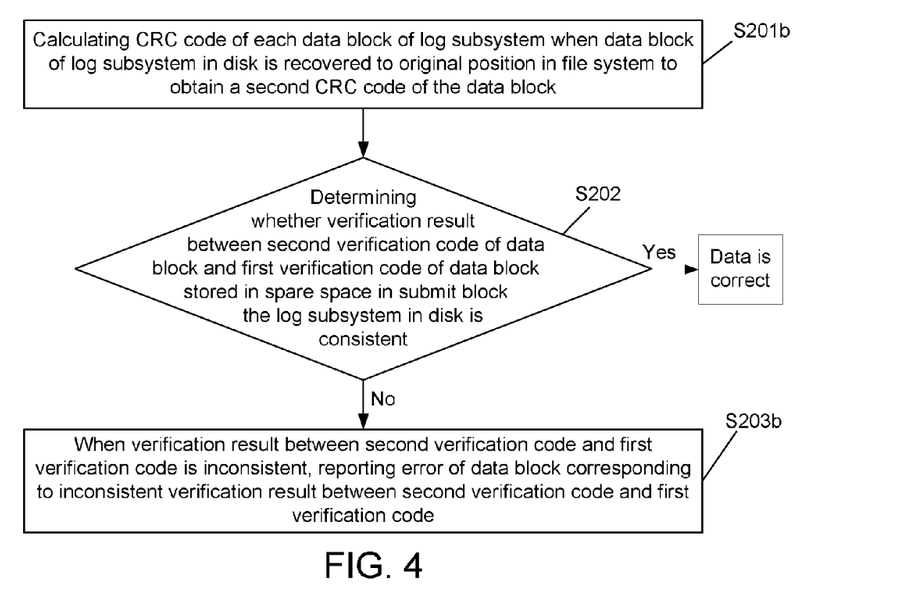
FIG. 4 is a flowchart of a method for error tracking a log subsystem of a file system according to another embodiment of the present invention.

When the first verification codes and the second verification codes of all of the data blocks in the log subsystem are CRC codes, the step of calculating the verification code of the data block to obtain the second verification code in step S201 includes step S201b, and step S203 includes step S203b. Referring to FIG. 4, associated details are given below.

In step S201b, the CRC code of each data block of the log subsystem is calculated to obtain a second CRC code of the data block.

In step S203b, when the verification result between the second verification code and the first verification code is inconsistent, an error is reported for the data block corresponding to the inconsistent verification result between the second verification code and the first verification code.

In current technologies, a CRC code is a CRC code that is calculated for each data block when a last verification code of one transaction is calculated. The last CRC code is a verification code accumulated from the CRC process of each of the data blocks. Thus, step S201b stores these intermediate CRC codes obtained during the last CRC code calculation process to a spare space in a submit block. The system may then compare these intermediate CRC codes in a next boot and recovery process, and the data block with an error can be identified if the error occurs.

With the first verification code and the second verification code of the data block in form of CRC codes, as the previously existing intermediate calculation results are preserved, an advantage of no additional operation amount is provided without affecting system performance.

Figure 5:
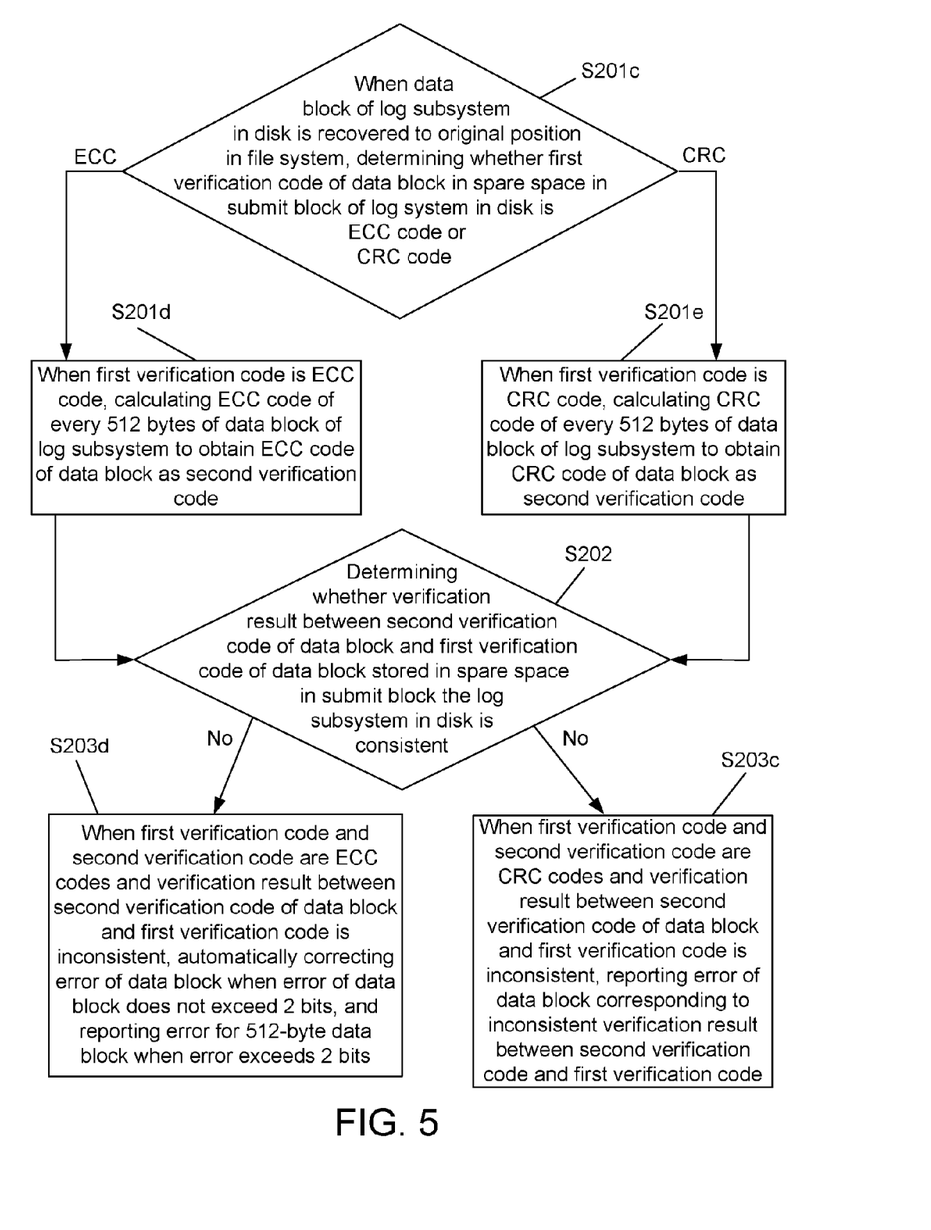
FIG. 5 is a flowchart of a method for error tracking a log subsystem of a file system according to another embodiment of the present invention.

The respective advantages of the ECC code and the CRC code can be combined. When the first verification code and the second verification code of a part of data blocks in the log subsystem are ECC codes, while the first verification code and the second verification code of another part of the data blocks are CRC codes, the step of calculating the verification code of the data block to obtain the second verification code in step S201 includes steps S201c, S201d and S201e, and step S203 includes steps S203c and S203d. Referring to FIG. 5, associated details are given below.

In step S201c, it is determined whether the first verification code of the data block in the spare space in the submit block of the log subsystem in the disk is an ECC code or a CRC code. When the first verification code is a ECC code, step S201d is performed, or else step S201e is performed when the first verification code is a CRC code.

In step S201d, when the first verification code is an ECC code, the ECC code of every 512 bytes of the data block of the log subsystem is calculated to obtain the ECC code of the data block as the second verification code.

In step S201e, when the first verification code is a CRC code, the CRC code of each data block in the log subsystem is calculated to obtain the CRC code of each data block as the second verification code.

In step S203c, when the first verification code and the second verification code are ECC codes and the verification code between the second verification code and the first verification code is inconsistent, for the 512-byte data block, an error of the data block is automatically corrected when the error does not exceed 2 bits, and an error is reported when the error exceeds 2 bits.

In step S203d, when the first verification code and the second verification code are CRC codes and the verification code between the second verification code and the first verification code is inconsistent, an error is reported for the data block corresponding to the inconsistent verification result between the second verification code and the first verification code.

Through the above approach, respective advantages of the ECC code and the CRC code are fully utilized, so as to allow a user to flexibly select appropriate corresponding verification codes according to actual requirements to achieve the object of error tracking a log subsystem of a file system.

In summary, according to an embodiment of the present invention, when a data block in a log subsystem in a disk is recovered to an original position in a file system, a verification code of the data block is calculated to obtain a second verification code. It is then determined whether a verification result between the second verification code of the data block and a first verification code of the data block stored in a spare space in a submit block of the log subsystem in the disk is consistent. When the verification result between the second verification code of the data block and the first verification code is inconsistent, the data block corresponding to the inconsistent the verification result between the second verification code of the data block and the first verification code is processed. Since the verification code needs to be stored at a disk and storage formats of the file system and the log subsystem at the disk are fixed, an incompatibility issue between an old system and a new disk data structure may be caused if a new space is divided and assigned for storing the verification code. However, with the above approach, according to an embodiment of the present invention, a spare space in a submit block is utilized to store the verification code. Thus, given the foundation of maintaining the existing disk data structure, the verification code stored is utilized for error tracking the log subsystem, thereby enhancing the reliability and achieving total forward compatibility of the log subsystem.

Figure 6:
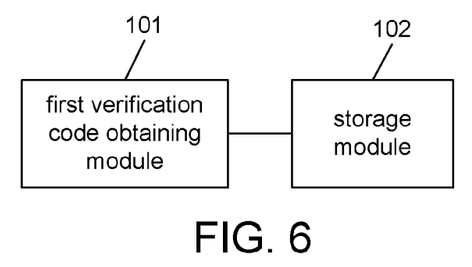
FIG. 6 is a schematic diagram of a processor according to an embodiment of the present invention.

FIG. 6 shows a schematic diagram of a processor according to an embodiment of the present invention. The processor includes a first verification code obtaining module 101 and a storage module 102.

When a log subsystem of a file system writes a data block to a disk, the first verification code obtaining module 102 calculates a verification code of the data block to obtain a first verification code.

A file system is a method and a data structure that an operating system applies on distinct disks or files of different sections, i.e., a method for organizing files on disks. In the embodiments of the present invention, as an independent log subsystem is utilized to track changes of contents in disks, a file system that carries such log subsystem offers better safety than a conventional file system.

A data block is a set of data including several sets of records successively arranged according to an order, and are a data unit transmitted between a main memory, an input/output apparatus and an external memory.

A file system and a log subsystem usually write data in a smallest unit of a data block, which ranges from 1 KB to 4 KB in size.

A verification code is a set of data that is obtained through a certain operation and is for checking whether target data is correct. For example, the verification code may include an ECC, CRC, and odd-even verification code. When a log subsystem of a file system writes a data block to a disk, the data block is calculated to obtain a first verification code. For example, the first verification code may be an ECC code, a CRC verification code, or an odd-even verification code.

The storage module 102 stores the calculated first verification code of the data block to a spare space in a submit block of the log subsystem in the disk.

For efficiency considerations, a system does not usually immediately write a data block to a disk each time a writing request for that data block arises. Instead, data blocks are gathered as many as possible, and are collectively written to the disk in one operation. In the log subsystem, such collective writing operation is referred to as one transaction.

The log subsystem writes a submit block at the end of each transaction written into the disk to indicate the end of that transaction. In a submit block, only 64 bytes are used while the remaining space is empty. According to an embodiment of the present invention, the calculated first verification code of the data block is stored to a spare space in a submit block of the log subsystem in the disk.

For example, the first verification codes of all data blocks of a log subsystem are ECC or CRC codes. Alternatively, the first verification codes of a part of data blocks are ECC codes, and the first verification codes of another part of the data blocks are CRC codes.

That is to say, when calculating the first verification code of the data block in the log subsystem, the ECC code is calculated for all of the data blocks, or the CRC code is calculated for all of the data blocks. Alternatively, the ECC code is calculated for a part of the data blocks, and the CRC code is calculated for another part of the data blocks. In practice, based on actual applications, appropriate verification codes can be selected when calculating the verification codes of data blocks.

In an embodiment of the present invention, when the log subsystem of the file system writes a data block to the disk, the first verification code of the data block is calculated, and the calculated first verification code of the data block is stored to a spare space in a submit block of the log subsystem in the disk. Since the first verification code of the data block is stored in the spare space in the submit block, such approach requires no additional space for storing the verification code and fully utilizes the spare space in the submit block. Further, compatible data have existing storage formats on the disk.

Figure 7:
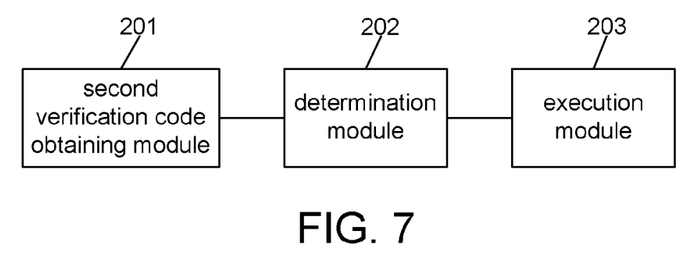
FIG. 7 is a schematic diagram of a processor according to another embodiment of the present invention.

FIG. 7 shows a schematic diagram of a processor according to another embodiment of the present invention. The processor includes a second verification code obtaining module 201, a determination module 202 and an execution module 203.

When a data block in the log subsystem in the disk is recovered to an original position in a file system, the second verification code obtaining module 201 calculates a verification code of the data block to obtain a second verification code.

The determination module 202 determines whether a verification result between the second verification code of the data block and a first verification code of the data block stored in a spare space in a submit block of the log subsystem in the disk is consistent, wherein methods for calculating the first verification code and the second verification code of the data block are consistent.

As the methods for calculating the first verification code and the second verification code are consistent, when the verification result between the second verification code of the data block and the first verification code of the data block stored in the spare space in the submit block of the log subsystem in the disk is consistent, it means that the data block recovered to the original position in the log subsystem is consistent with the data block in log subsystem in the disk, i.e., the data is correct and without error.

The execution module 203 processes the data block corresponding to the inconsistent verification result between the second verification code and the first verification code when the verification result between the second verification code and the first verification code is inconsistent.

When the verification result between the second verification code of the data block and a first verification code is inconsistent, it means that the data block recovered to the original position in the log subsystem is inconsistent with the data block in log subsystem in the disk, i.e., the data of the data block recovered to the original position of the file system is incorrect. At this point, the data block corresponding to the inconsistent verification code between second verification code of the data block and the first verification code is processed, so as to notify the user to be aware of the incorrect data block recovered to the original position in the file system to allow the user to take active remedial measures.

When calculating the verification code of the data block in the log subsystem, the verification code of every predetermined number of bytes of the data block in the log subsystem is calculated to obtain the second verification code of the data block. In the example below, it is assumed that the verification code is an ECC code, and the predetermined number of bytes is 512 bytes.

When the first verification code and the second verification code of all data blocks of the log subsystem are ECC codes, the second verification code obtaining module 201 calculates ECC code of each 512 bytes of the data block of the log subsystem to obtain the second ECC code of the data block. When the verification result between the second verification code and the first verification code is inconsistent, the execution module 203 automatically corrects an error of the data block when the error of the data block does not exceed 2 bits, and reports the error of the data block when the error of the data block exceeds 2 bits.

When the first verification code and the second verification code of all the data blocks of the log subsystem are CRC codes, the second verification code obtaining module 201 calculates the CRC code of each data block in the log subsystem to obtain the second CRC code of each data block. The execution module 203 reports the error for the data block corresponding to the inconsistent verification result between the second verification code and the first verification code when the verification result between the second verification code and the first verification code is inconsistent.

Further, the first verification codes and the second verification codes of a part of the data blocks in the log subsystem are ECC codes, and the first verification codes and the second verification codes of another part of the data blocks are CRC codes.

In summary, according to an embodiment of the present invention, when a data block in a log subsystem in a disk is recovered to an original position in a file system, a verification code of the data block is calculated to obtain a second verification code. It is then determined whether a verification result between the second verification code of the data block and a first verification code of the data block stored in a spare space in a submit block of the log subsystem in the disk is consistent. When the verification result between the second verification code of the data block and the first verification code is inconsistent, the data block corresponding to the inconsistent the verification result between the second verification code of the data block and the first verification code is processed. Since the verification code needs to be stored at a disk and storage formats of the file system and the log subsystem at the disk are fixed, an incompatibility issue between an old system and a new disk data structure may be caused if a new space is divided and assigned for storing the verification code. However, with the above approach, according to an embodiment of the present invention, a spare space in a submit block is utilized to store the verification code. Thus, given the foundation of maintaining the existing disk data structure, the verification code stored is utilized for error tracking the log subsystem, thereby enhancing the reliability and achieving total forward compatibility of the log subsystem.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures. Without departing from the spirit and scope of the present invention, the embodiments can be implemented by other forms, structures, arrangements, ratios and other components and elements.

What is claimed is:

1. A method for writing a log subsystem of a file system, wherein a data block is written to the log subsystem prior to writing the data block from said log subsystem to the file system, comprising:
    calculating a first verification code of the data block when the log subsystem performs a first transaction by writing the data block to a disk;
    writing a submit block at an end of said first transaction, wherein the submit block indicates the end of said first transaction and comprises a spare space; and
    storing the first verification code of the data block to said spare space in said submit block;
    wherein said first verification code is for performing error correction, and wherein since said first verification code is stored in said spare space in said submit block, said first verification code requires no additional space for storing and said spare space is fully utilized in said submit block.

2. The method according to claim 1, wherein the first verification codes of all data blocks of the log subsystem are error check code (ECC) or cyclic redundancy check (CRC) codes; or the first verification codes of a part of the data blocks are ECC codes and the first verification codes of another part of the data blocks are CRC codes.

3. A method for error tracking a log subsystem of a file system, wherein a data block is written to the log subsystem prior to writing the data block from said log subsystem to the file system, comprising:
    calculating a first verification code of the data block when the log subsystem performs a first transaction by writing the data block to a disk;
    writing a submit block at an end of said first transaction, wherein the submit block indicates the end of said first transaction and comprises a spare space;
    storing the first verification code of the data block to said spare space in said submit block;
    calculating a second verification code of the data block when the data block of the log subsystem in a disk is recovered to an original position in the file system;
    determining a verification result by comparing the second verification code and said first verification code, wherein methods for calculating the first verification code and the second verification code are consistent; and
    processing the data block corresponding to the verification result when the verification result is inconsistent;
    wherein said first verification code is for performing error correction, and wherein since said first verification code is stored in said spare space in said submit block, said first verification code requires no additional space for storing and said spare space is fully utilized in said submit block.

4. The method for error tracking a log subsystem of a file system according to claim 3, wherein the first verification codes and the second verification codes of all data blocks of the log subsystem are ECC codes.

5. The method for error tracking a log subsystem of a file system according to claim 4, wherein the step of calculating the second verification code of the data block comprises:
calculating the ECC code of every predetermined number of bytes of the data block of the log subsystem to obtain the ECC code as the second verification code of the data block.

6. The method for error tracking a log subsystem of a file system according to claim 5, wherein the predetermined number of bytes is 512 bytes.

7. The method for error tracking a log subsystem of a file system according to claim 6, wherein the step of processing the data block corresponding to the inconsistent verification result between the second verification code and the first verification code comprises:
when the verification result between the second verification code and the first verification code is inconsistent and an error of the data block does not exceed 2 bits, automatically correcting the error of the data block, and reporting the error of the data block when the error of the 512-byte data block exceeds 2 bits.

8. The method for error tracking a log subsystem of a file system according to claim 3, wherein the first verification codes and the second verification codes of all data blocks of the log subsystem are CRC codes.

9. The method for error tracking a log subsystem of a file system according to claim 8, wherein the step of calculating the second verification code of the data block comprises:
calculating the CRC code of each data block of the log subsystem to obtain the CRC code of each data block as the second verification code.

10. The method for error tracking a log subsystem of a file system according to claim 8, wherein the step of processing the data block corresponding to the inconsistent verification result between the second verification code and the first verification code comprises:
when the verification result between the second verification code and the first verification code is inconsistent, reporting an error of the data block corresponding to the inconsistent verification result between the second verification code and the first verification code.

11. The method for error tracking a log subsystem of a file system according to claim 3, wherein the first verification codes and the second verification codes of a part of data blocks of the log subsystem are ECC codes, and the first verification codes and the second verification codes of another part of the data blocks are CRC codes.

12. A processor for a log subsystem of a file system, wherein a data block is written to the log subsystem prior to writing the data block from said log subsystem to the file system, comprising:
a first verification code obtaining module, calculating a first verification code of the data block when the log subsystem of the file system performs a first transaction by writing the data block to a disk; and
a storage module, storing the first verification code of the data block to a spare space in a submit block of the log subsystem of the file system, wherein said submit block is written at an end of said first transaction and indicates the end of the transaction; wherein said first verification code is for performing error correction, and wherein since said first verification code is stored in said spare space in said submit block, said first verification code requires no additional space for storing and said spare space is fully utilized in said submit block.

13. The processor according to claim 12, wherein the first verification codes of all data blocks of a log subsystem are ECC or CRC codes, or the first verification codes of a part of data blocks are ECC codes and the first verification codes of another part of the data blocks are CRC codes.

14. The processor according to claim 12, further comprising:
a second verification code obtaining module, calculating a second verification code of a data block of a log subsystem of a file system when the data block is recovered to an original position in the file system;
a determination module, determining whether a verification result between the second verification code of the data block and the first verification code of the data block stored in the spare space in the submit block of the log subsystem in the disk is consistent, wherein methods for calculating the first verification code and the second verification code of the data block are consistent; and
an execution module, processing the data block corresponding to the inconsistent verification result between the second verification code and the first verification code when the verification result between the second verification code and the first verification code is inconsistent.

15. The processor according to claim 14, wherein the first verification codes and the second verification codes of all data blocks of the log subsystem are ECC codes.

16. The processor according to claim 15, wherein second verification code obtaining module calculates the ECC code of every predetermined number of bytes of the data block of the log subsystem to obtain the ECC code as the second verification code of the data block.

17. The processor according to claim 16, wherein the predetermined number of bytes is 512 bytes.

18. The processor according to claim 17, wherein when the verification result between the second verification code and the first verification code is inconsistent and an error of the data block does not exceed 2 bits, the execution module automatically corrects the error of the data block, and reports the error of the data block when the error of the 512-byte data block exceeds 2 bits.

19. The processor according to claim 14, wherein the first verification codes and the second verification codes of all data blocks of the log subsystem are CRC codes.

20. The processor according to claim 19, wherein the second verification code obtaining module calculates the CRC code of each data block of the log subsystem to obtain the CRC code of each data block as the second verification code.

21. The processor according to claim 19, wherein when the verification result between the second verification code and the first verification code is inconsistent, the second verification code obtaining module reports an error of the data block corresponding to the inconsistent verification result between the second verification code and the first verification code.

22. The processor according to claim 14, wherein the first verification codes and the second verification codes of a part of data blocks of the log subsystem are ECC codes, and the first verification codes and the second verification codes of another part of the data blocks are CRC codes.

* * * * *